(12) United States Patent
Nagai et al.

(10) Patent No.: US 7,134,942 B2
(45) Date of Patent: Nov. 14, 2006

(54) WAFER PROCESSING METHOD

(75) Inventors: Yusuke Nagai, Tokyo (JP); Masashi Aoki, Tokyo (JP); Hitoshi Hoshino, Tokyo (JP)

(73) Assignee: Disco Corporation, Tokyo (JP)

( * ) Notice: Subject to any disclaimer, the term of this patent is extended or adjusted under 35 U.S.C. 154(b) by 76 days.

(21) Appl. No.: 10/936,678

(22) Filed: Sep. 9, 2004

(65) Prior Publication Data
US 2005/0059325 A1 Mar. 17, 2005

(30) Foreign Application Priority Data
Sep. 11, 2003 (JP) .............................. 2003-319824

(51) Int. Cl.
*B24B 1/00* (2006.01)
*H01L 21/463* (2006.01)

(52) U.S. Cl. .......................... 451/41; 451/55; 438/33; 438/462; 438/463; 438/464

(58) Field of Classification Search .................. 438/33, 438/460, 462, 463, 464, 465; 451/41, 54, 451/55, 63
See application file for complete search history.

(56) References Cited

U.S. PATENT DOCUMENTS

| | | | | |
|---|---|---|---|---|
| 5,238,876 A | * | 8/1993 | Takeuchi et al. | 438/464 |
| 5,527,744 A | * | 6/1996 | Mignardi et al. | 216/2 |
| 5,693,182 A | * | 12/1997 | Mathuni | 438/727 |
| 6,337,258 B1 | * | 1/2002 | Nakayoshi et al. | 438/464 |
| 6,420,245 B1 | * | 7/2002 | Manor | 438/460 |
| 6,562,698 B1 | * | 5/2003 | Manor | 438/460 |
| 6,583,032 B1 | * | 6/2003 | Ishikawa et al. | 438/462 |
| 6,756,562 B1 | * | 6/2004 | Kurosawa et al. | 219/121.67 |
| 6,770,544 B1 | * | 8/2004 | Sawada | 438/462 |
| 6,827,636 B1 | * | 12/2004 | Yamada | 451/65 |
| 6,939,785 B1 | * | 9/2005 | Kajiyama et al. | 438/463 |

FOREIGN PATENT DOCUMENTS

| | | |
|---|---|---|
| JP | 6-120334 | 4/1994 |
| JP | 2002-192367 | 7/2002 |

* cited by examiner

*Primary Examiner*—Timothy V. Eley
(74) *Attorney, Agent, or Firm*—Smith, Gambrell & Russell, LLP

(57) ABSTRACT

A wafer processing method for dividing a wafer having optical devices that are formed in a plurality of areas sectioned by dividing lines formed in a lattice pattern on the front surface, along the dividing lines, which comprises a laser beam application step of applying a laser beam to the wafer along the dividing lines from the side of the back surface thereof to form grooves having a predetermined depth in the back surface; a protective sheet affixing step of affixing a protective sheet to the front surface of the wafer having the grooves in the back surface; a dividing step of dividing the wafer having the protective sheet affixed to the front surface along the grooves; and a grinding step of grinding the back surface of the wafer divided along the grooves in a state of the protective sheet being affixed to the wafer, to remove the grooves.

4 Claims, 5 Drawing Sheets

(a)

(b)

(a)

(b)

(a)

(b)

(a)

(b)

WAFER PROCESSING METHOD

FIELD OF THE INVENTION

The present invention relates to a wafer processing method for dividing a wafer having optical devices that are formed in a plurality of areas sectioned by dividing lines (streets) formed in a lattice pattern on the front surface, along the dividing lines.

DESCRIPTION OF THE PRIOR ART

A wafer having optical devices comprising a gallium nitride-based compound semiconductor which are formed in a plurality of areas sectioned by dividing lines (streets) formed in a lattice pattern on the front surface of a sapphire substrate and the like is divided along the dividing lines into individual optical devices such as light emitting diodes or laser diodes which are widely used in electric equipment. This wafer is generally divided by a cutting machine called "dicer". The cutting machine comprises a chuck table for holding a workpiece such as a semiconductor wafer or optical device wafer, a cutting means for cutting the workpiece held on the chuck table, and a moving means for moving the chuck table and the cutting means relative to each other. The cutting means comprises a rotary spindle that is rotated at a high speed and a cutting blade mounted to the spindle. The cutting blade comprises a disk-like base and an annular cutting edge that is mounted on the side wall outer peripheral portion of the base, and the cutting edge is formed as thick as about 20 µm by fixing, for example, diamond abrasive grains having a diameter of about 3 µm to the base by electroforming.

Since a sapphire substrate, silicon carbide substrate, or the like has a high Mohs hardness, cutting with the above cutting blade is not always easy. Since the cutting blade has a thickness of about 20 µm, the dividing lines for sectioning optical devices need to have a width of about 50 µm. Therefore, in the case of an optical device measuring, for example, about 300 µm×300 µm, there is a problem that the area ratio of the dividing lines to the optical device is large, thereby reducing productivity.

Meanwhile, a processing method for dividing a wafer by applying a laser beam along streets is attempted and disclosed by JP-A 6-120334, for example.

When a laser beam is applied to the front surface of a wafer to process it, however, heat energy is concentrated on the exposed area to produce debris that stick fast to the front surface of the wafer, thereby greatly reducing the quality of optical devices.

As means of dividing a wafer by applying a laser beam along streets, a laser beam processing method in which a laser beam capable of passing through the wafer is used and the laser beam is applied to the wafer with its focusing point on the inside of the area to be divided is also attempted and disclosed by JP-A 2002-192367, for example. In the dividing method using this laser beam processing technique, a workpiece is divided by applying a laser beam capable of passing through the wafer, for example, a laser beam having an infrared range, with its focusing point on the inside of the wafer from one side thereof to continuously form deteriorated layers in the inside of the wafer along the dividing lines and then, applying external force along the dividing lines whose strength has been reduced by the formation of the deteriorated layers.

When the deteriorated layer is formed by applying a laser beam with its focusing point on the center portion of the inside of the area to be divided of the wafer, there is a problem that it remains around the optical device, and light emitted from the optical device is absorbed by the deteriorated portion to reduce the brightness of the optical device. Further, when grooves are formed by applying a laser beam to the area to be divided of the wafer and are cut, a molten layer remains on the side surfaces of the optical device, and light emitted from the optical device is absorbed by the molten layer to reduce the brightness of the optical device.

SUMMARY OF THE INVENTION

It is an object of the present invention to provide a wafer processing method having high productivity and capable of dividing a wafer without reducing the brightness of an optical device.

To attain the above object, according to the present invention, there is provided a wafer processing method for dividing a wafer having optical devices that are formed in a plurality of areas sectioned by dividing lines formed in a lattice pattern on the front surface, along the dividing lines, comprising:

a laser beam application step of applying a laser beam to the wafer along the dividing lines from the side of the back surface thereof to form grooves having a predetermined depth in the back surface;

a protective sheet affixing step of affixing a protective sheet to the front surface of the wafer having the grooves in the back surface;

a dividing step of dividing the wafer having the protective sheet affixed to the front surface along the grooves; and a grinding step of grinding the back surface of the wafer divided along the grooves in a state of the protective sheet being affixed to the wafer, to remove the grooves.

Further, according to the present invention, there is provided a wafer processing method for dividing a wafer having optical devices that are formed in a plurality of areas sectioned by dividing lines formed in a lattice pattern on the front surface, along the dividing lines, comprising:

a protective sheet affixing step of affixing a protective sheet to the front surface of the wafer;

a laser beam application step of applying a laser beam to the wafer having the protective sheet affixed to the front surface thereof along the dividing lines from the side of the back surface thereof to form grooves having a predetermined depth in the back surface;

a dividing step of dividing the wafer having the protective sheet affixed to the front surface along the grooves; and a grinding step of grinding the back surface of the wafer divided along the grooves in a state of the protective sheet being affixed to the wafer, to remove the grooves.

In the present invention, as the grooves formed along the dividing lines in the back surface of the wafer by the laser beam application step are removed by carrying out the grinding step after the wafer has been divided, the brightness of the optical devices is not reduced. In the present invention, since the wafer is cut along the grooves formed along the dividing lines, there is no cutting margin unlike cutting with a cutting blade. Therefore, the area ratio of the dividing lines to the optical device can be reduced and productivity can be thereby improved.

DETAILED DESCRIPTION OF THE PREFERRED EMBODIMENTS

A wafer processing method according to preferred embodiments of the present invention will be described in detail hereinunder with reference to the accompanying drawings.

Figure 1:
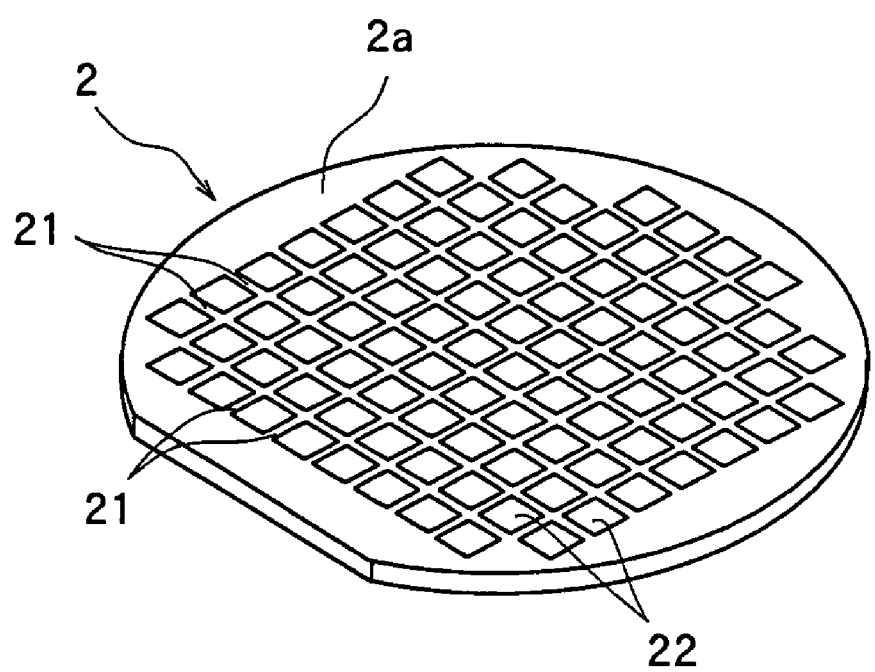
FIG. 1 is a perspective view of an optical device wafer to be divided by the wafer processing method of the present invention.

FIG. 1 is a perspective view of an optical device wafer 2 to be divided according to the present invention. In the optical device wafer 2 shown in FIG. 1, a plurality of dividing lines 21 are formed in a lattice pattern on the front surface 2*a* thereof, and optical devices 22 in which a gallium nitride-based compound semiconductor and the like is laminated are formed in a plurality of areas sectioned by the dividing lines 21. This optical device wafer 2 has the optical devices 22 measuring 0.3 mm×0.3 mm formed on the surface of a sapphire substrate having a diameter of 2 inches and a thickness of 430 µm in the illustrated embodiment. The processing method for dividing this optical device wafer 2 into individual optical devices 22 according to a first embodiment will be described with reference to FIGS. 2 to 5.

Figure 2:
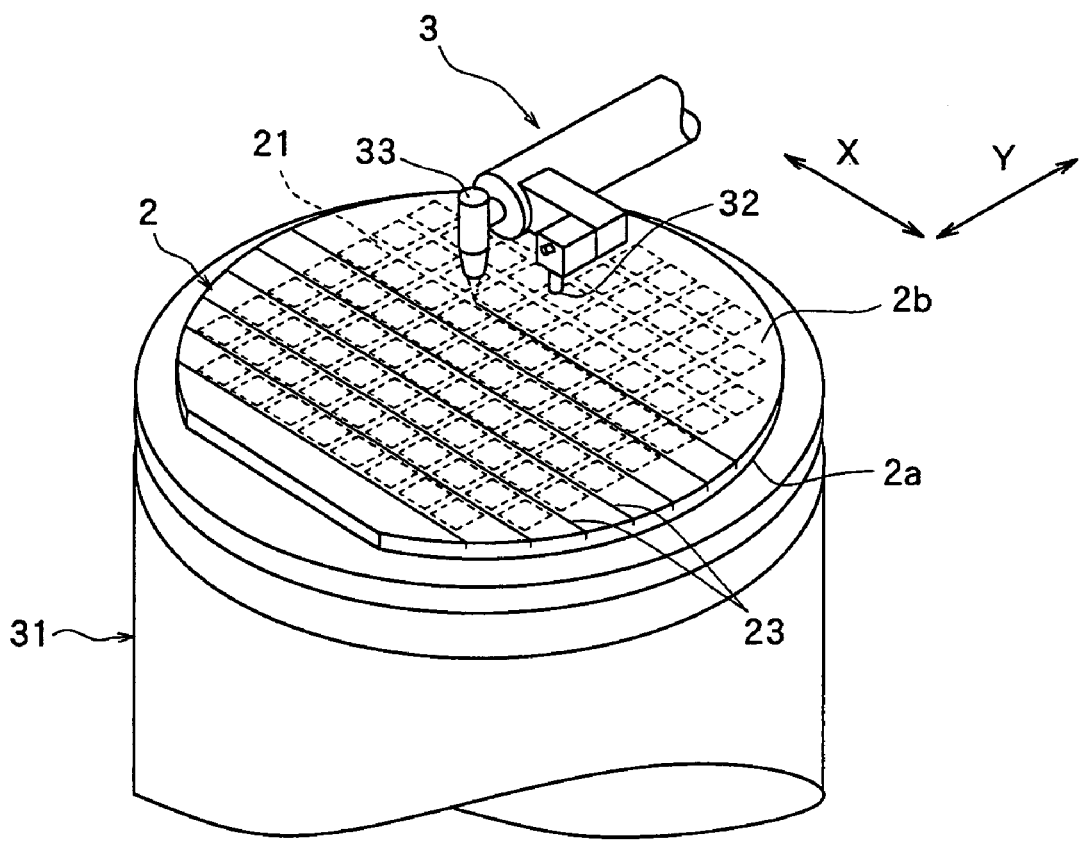
FIGS. 2(*a*) and 2(*b*) are diagrams for explaining the laser beam application step in the wafer processing method of the present invention.
Figure 2:
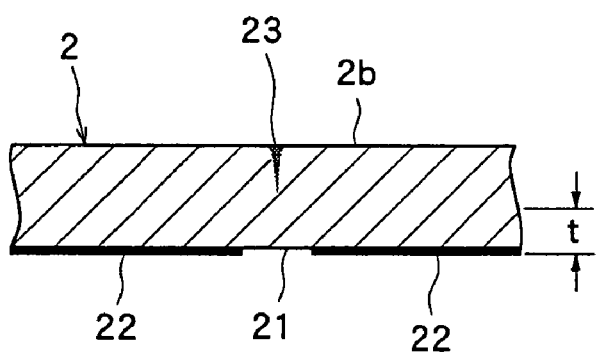

In the first embodiment, the step of applying a laser beam to the above optical device wafer 2 along the dividing lines 21 from the side of the back surface 2*b* thereof to form grooves having a predetermined depth in the back surface 2*b* is first carried out. This laser beam application step is carried out by a laser beam processing machine 3 as shown in FIG. 2(*a*). That is, the optical device wafer 2 is held on the chuck table 31 of the laser beam processing machine 3 in such a manner that the back surface 2*b* faces up and positioned right below an image pick-up means 32. Image processing such as pattern matching for aligning a laser beam application means 33 with the above dividing lines 21 is carried out by the image pick-up means 32 and a control means (not shown) to perform the alignment of a laser beam application position. On this occasion, since the front surface 2*a* having the dividing lines 21 is located on the underside of the optical device wafer 2, the image pick-up means 32 which is constituted by an infrared illuminating means, an optical system for capturing infrared radiation and an image pick-up device (infrared CCD) for outputting an electric signal corresponding to the infrared radiation is used to take an image of each dividing line 21.

After the alignment of the laser beam application position is carried out as described above, the chuck table 31 is moved to a laser beam application area where the laser beam application means 33 is located and processing-fed in a direction indicated by an arrow X while a laser beam is applied from the laser beam application means 33 with its focusing point on the back surface 2*b*, that is, on the top surface of the optical device wafer 2. The optical device wafer 2 is reciprocated 25 times at a feed rate of 50 mm/sec. As a result, a groove 23 having, for example, a width of 50 µm and a depth of 200 µm is formed along the dividing line 21 in the back surface 2*b* of the optical device wafer 2 as shown in FIG. 2(*b*). The depth of the groove 23 must be set to a value smaller than the finish thickness t (thickness from the front surface on which the optical device 22 is formed: for example, 200 µm) of the optical devices 22 formed on the optical device wafer 2, desirably 10 to 50% of the thickness of the optical device wafer 2. The following ultraviolet laser beam may be used as the laser beam applied in the above laser beam application step.

Laser: YVO4 pulse laser
Wavelength: 355 nm
Pulse energy: 10 µJ
Focusing spot diameter: 5 µm
Pulse width: 12 ns
Repetition frequency: 50 kHz After the groove 23 is formed along the dividing line 21 in a predetermined direction formed on the optical device wafer 2 as described above, the chuck table 31 or the laser beam application means 33 is indexing-fed by the interval between adjacent dividing lines 21 in an indexing direction indicated by an arrow Y and processing-fed while a laser beam is applied again. After the above processing-feed and indexing-feed are carried out along all the dividing lines 21 formed in the predetermined direction, the chuck table 31 is turned at 90° to carry out the above processing-feed and indexing-feed along dividing lines 21 formed in a direction perpendicular to the above predetermined direction, thereby making it possible to form grooves 23 along all the dividing lines 21 in the back surface 2*b* of the optical device wafer 2.

Figure 3:
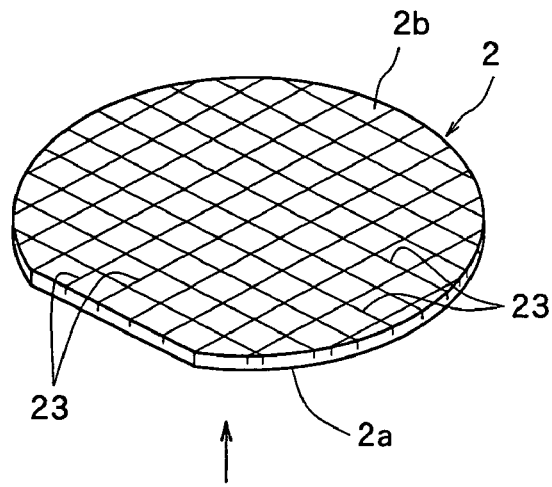
FIGS. 3(*a*) and 3(*b*) are diagrams for explaining the protective sheet affixing step in the wafer processing method of the present invention.
Figure 3:
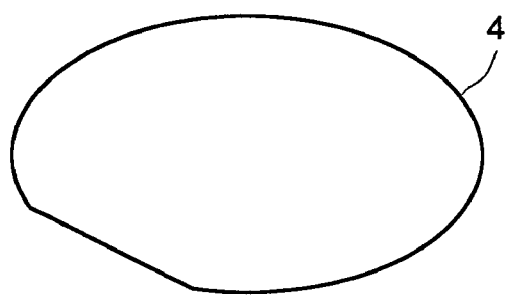
Figure 3:
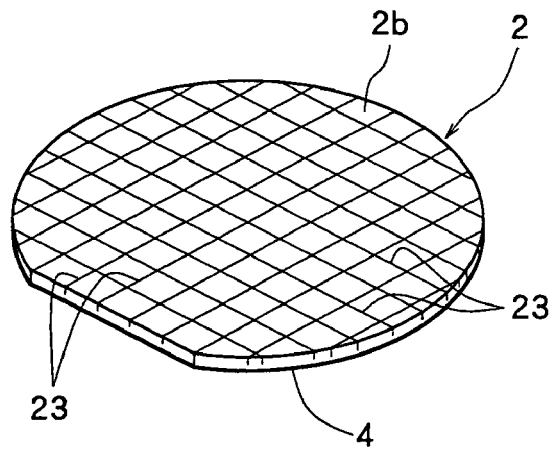

After the above laser beam application step is carried out, the protective sheet affixing step of affixing a protective sheet 4 to the front surface 2*a* of the optical device wafer 2 having the grooves 23 formed in the back surface 2*b* is carried out as shown in FIG. 3(*a*) and FIG. 3(*b*).

Figure 4:
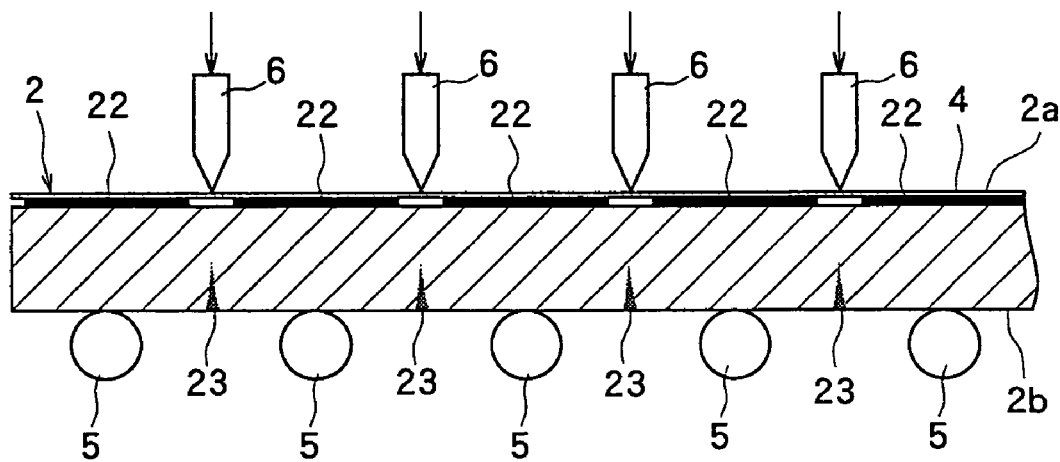
FIGS. 4(*a*) and 4(*b*) are diagrams for explaining the dividing step in the wafer processing method of the present invention.
Figure 4:
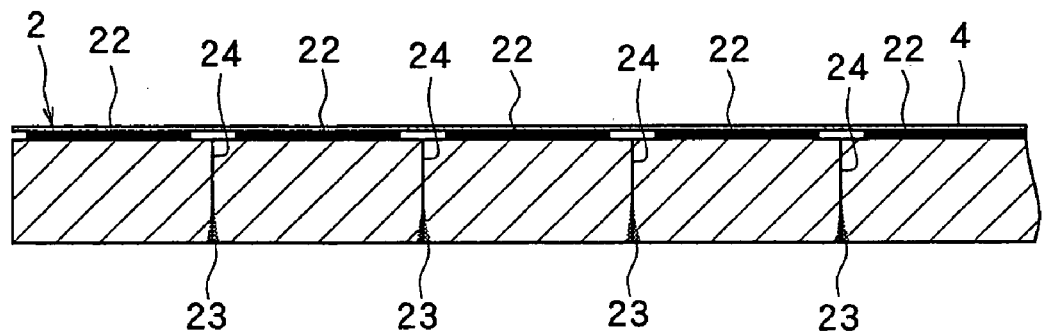
Figure 5:
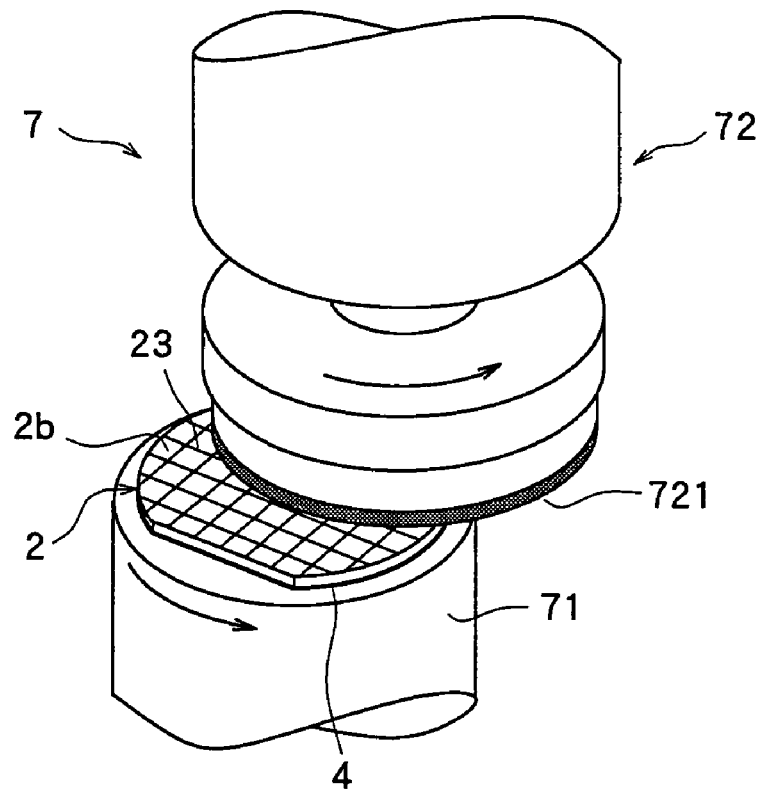
FIGS. 5(*a*) and 5(*b*) are diagrams for explaining the grinding step in the wafer processing method of the present invention.
Figure 5:
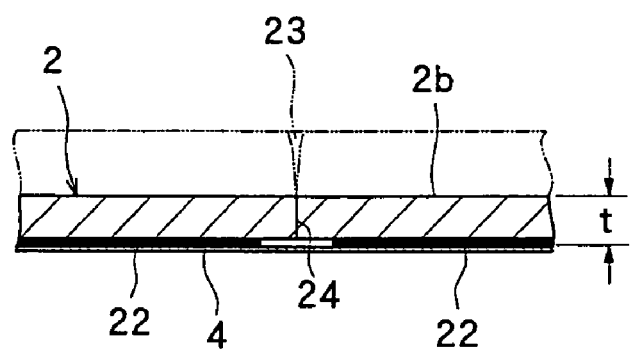

Thereafter, the dividing step of dividing the optical device wafer 2 having the protective sheet 4 affixed to the front surface 2*a* along the dividing lines 21 is carried out. In this dividing step, as shown in FIG. 4(*a*), the optical device wafer 2 is placed on a plurality of columnar support members 5 arranged parallel to one another in such a manner that the back surface 2*b* faces down. At this point, the optical device wafer 2 is arranged such that the grooves 23 formed in the back surface 2*b* are each positioned between adjacent support members 5 and 5. The protective sheet 4 affixed to the front surface 2*a* of the optical device wafer 2 is pressed along the grooves 23, that is, the dividing lines 21 by pressing members 6. As a result, a bending load acts on the optical device wafer 2 along the grooves 23, that is, the dividing lines 21 to generate tensile stress in the back surface 2*b*, thereby forming cracks 24 in the optical device wafer 2 along grooves 23, that is, dividing lines 21, formed in a predetermined direction to divide the optical device wafer 2 as shown in FIG. 4(*b*). After the optical device wafer 2 is divided along the grooves 23, that is, the dividing lines 21, formed in the predetermined direction, the optical device wafer 2 is turned at 90° to carry out the above dividing work along grooves 23, that is, dividing lines 21, formed in a direction perpendicular to the above predetermined direction, whereby the optical device wafer 2 can be divided into individual optical devices 22. Since the individual optical devices 22 have the protective sheet 4 affixed to the front surface 2*a,* they do not fall apart and the shape of the optical device wafer 2 is maintained.

After the dividing step is carried out as described above, the grinding step of grinding the back surface 2*b* of the optical device wafer 2 in a state of the protective sheet 4 being affixed to the front surface 2a of the optical device wafer 2 to remove the grooves 23 is carried out. This grinding step is carried out by a grinding machine 7 comprising a chuck table 71 and a grinding means 72 having a grinding whetstone 721 as shown in FIG. 5(a). That is, the optical device wafer 2 is held on the chuck table 71 in such a manner that the back surface 2b faces up and the grinding whetstone 721 of the grinding means 72 is rotated at 6,000 rpm and brought into contact with the back surface 2b of the optical device wafer 2 while the chuck table 71 is rotated at 300 rpm, to grind it. The optical device wafer 2 is divided into individual optical devices 22 and ground to a predetermined finish thickness t (for example, 200 μm) to remove the grooves 23 as shown in FIG. 5(b).

As the individual optical devices 22 from which the grooves 23 have thus been removed have no laser beam processed portion on the side surfaces, the brightness of the optical devices 22 does not lower. In the above embodiment, as the laser beam is applied to the back surface 2b of the optical device wafer 2 in the laser beam application step, even when debris are produced, they do not adhere to the optical devices 22 formed on the front surface 2a of the optical device wafer 2. The debris are removed by grinding the back surface 2b of the optical device wafer 2.

The processing method for dividing the optical device wafer 2 into individual optical devices 22 according to a second embodiment will be described hereinbelow.

In the second embodiment, the order of the above laser beam application step and the protective sheet affixing step in the first embodiment is reversed. That is, in the second embodiment, the step of affixing the protective sheet 4 to the front surface 2a of the optical device wafer 2 is first carried out. Then, the optical device wafer 2 having the protective sheet 4 affixed to the front surface 2a is held on the chuck table 31 of the laser beam processing machine 3 in such a manner that the back surface 2b faces up as shown in FIG. 2(a) to carry out the above laser beam application step. After the protective sheet affixing step and the laser beam application step are carried out, the dividing step and the grinding step in the first embodiment are carried out likewise in the second embodiment.

We claim:

1. A wafer processing method for dividing a wafer having optical devices that are formed in a plurality of areas sectioned by dividing lines formed in a lattice pattern on a front surface, along the dividing lines, comprising:
    a laser beam application step of applying a laser beam of a wavelength absorbed by the wafer to the wafer along the dividing lines from the side of a back surface thereof to form grooves having a predetermined depth in the back surface;
    a protective sheet affixing step of affixing a protective sheet to the front surface of the wafer having the grooves in the back surface;
    a dividing step of dividing the wafer having the protective sheet affixed to the front surface along the grooves; and
    a grinding step of grinding the back surface of the wafer divided along the grooves in a state of the protective sheet being affixed to the wafer, to remove the grooves.

2. The wafer processing method of claim 1, wherein the laser beam wavelength is 355 nm.

3. A wafer processing method for dividing a wafer having optical devices that are formed in a plurality of areas sectioned by dividing lines formed in a lattice pattern on a front surface, along the dividing lines, comprising:
    a protective sheet affixing step of affixing a protective sheet to the front surface of the wafer;
    a laser beam application step of applying a laser beam of a wavelength absorbed by the wafer to the wafer having the protective sheet affixed to the front surface thereof along the dividing lines from the side of a back surface thereof to form grooves having a predetermined depth in the back surface;
    a dividing step of dividing the wafer having the protective sheet affixed to the front surface along the grooves; and
    a grinding step of grinding the back surface of the wafer divided along the grooves in a state of the protective sheet being affixed to the wafer, to remove the grooves.

4. The wafer processing method of claim 3, wherein the laser beam wavelength is 355 nm.

* * * * *